United States Patent
Kang

(10) Patent No.: US 7,564,714 B2
(45) Date of Patent: Jul. 21, 2009

(54) FLASH MEMORY DEVICE AND METHOD OF CONTROLLING PROGRAM VOLTAGE

(75) Inventor: Young Su Kang, Yongin-si (KR)

(73) Assignee: Hynix Semiconductor Inc., Icheon-si (KR)

(*) Notice: Subject to any disclaimer, the term of this patent is extended or adjusted under 35 U.S.C. 154(b) by 128 days.

(21) Appl. No.: 11/754,037

(22) Filed: May 25, 2007

(65) Prior Publication Data
US 2008/0232172 A1 Sep. 25, 2008

(30) Foreign Application Priority Data
Mar. 20, 2007 (KR) .................. 10-2007-0027217

(51) Int. Cl.
*G11C 16/04* (2006.01)
(52) U.S. Cl. .................. 365/185.17; 365/185.22; 365/185.19
(58) Field of Classification Search .......... 365/185.17, 365/185.22, 185.19
See application file for complete search history.

(56) References Cited

U.S. PATENT DOCUMENTS

| 7,020,017 B2 | 3/2006 | Chen et al. | |
| 7,274,599 B2* | 9/2007 | Lee | 365/185.22 |
| 2005/0248991 A1* | 11/2005 | Lee et al. | 365/185.28 |

FOREIGN PATENT DOCUMENTS

| KR | 10-2006-0025601 A | 3/2006 |
| KR | 1020060104395 A | 10/2006 |

* cited by examiner

*Primary Examiner*—Huan Hoang
(74) *Attorney, Agent, or Firm*—Townsend and Townsend and Crew LLP

(57) ABSTRACT

A memory cell array of a NAND flash memory device includes memory cells connected to bit lines and word lines. A page buffer unit includes cell program test circuits configured to program data into a selected memory cell or read data from the memory cell. An IO controller includes a program confirm decision circuit for outputting a cell program confirmation signal when a cell is programmed. A voltage providing unit changes a step of a program voltage according to the cell program confirmation signal and provides the program voltage.

10 Claims, 8 Drawing Sheets

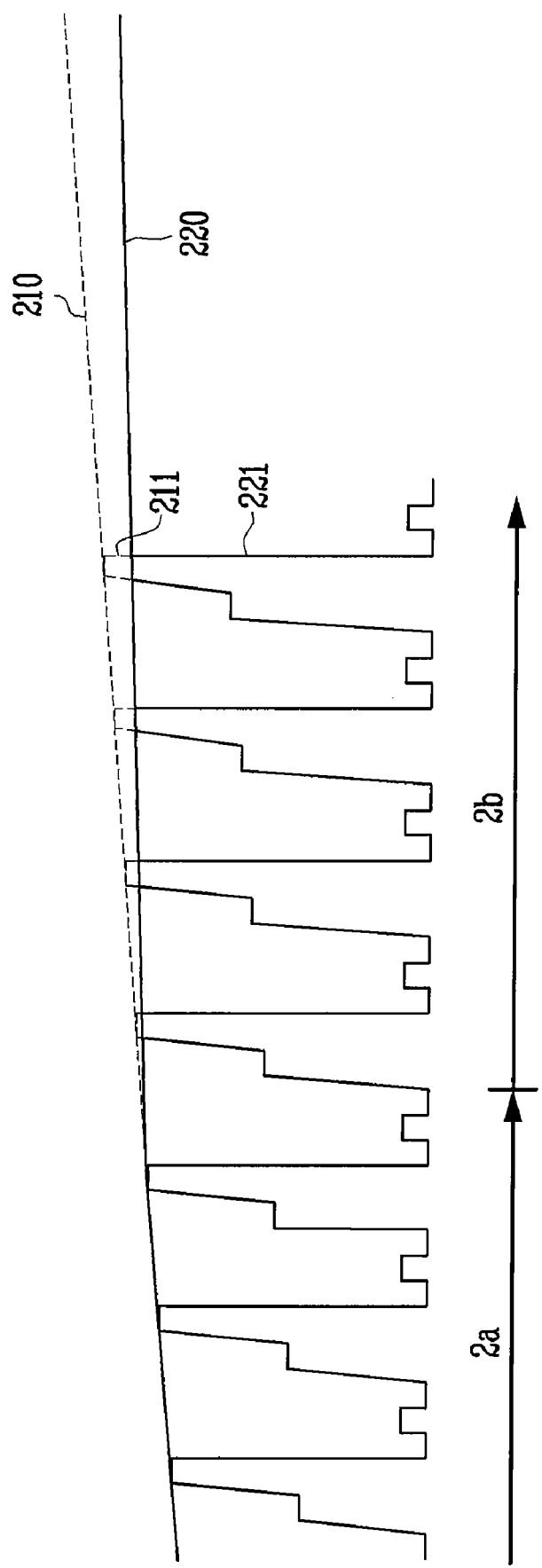

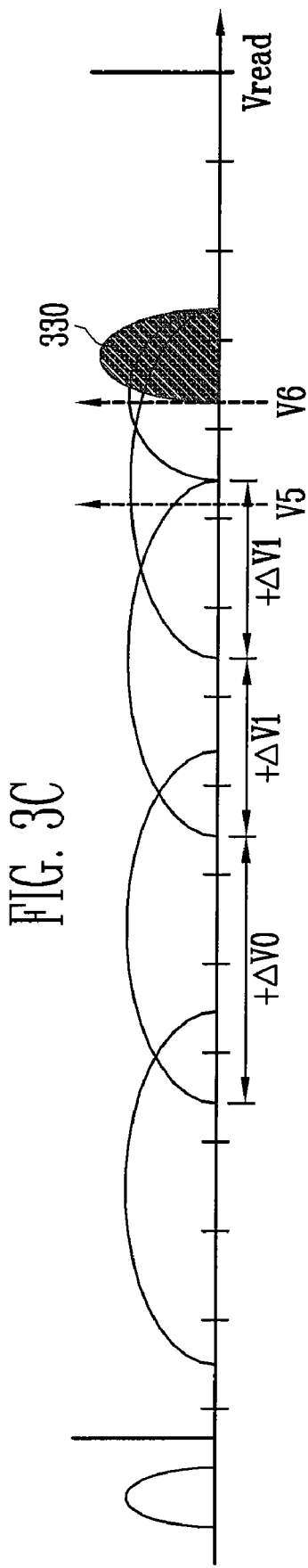

180# FLASH MEMORY DEVICE AND METHOD OF CONTROLLING PROGRAM VOLTAGE

CROSS-REFERENCES TO RELATED APPLICATIONS

The present application claims priority to Korean patent application number 10-2007-027217, filed on Mar. 20, 2007, which is incorporated by reference in its entirety.

BACKGROUND OF THE INVENTION

The present invention relates, in general, to flash memory devices and, more particularly, to a flash memory device and a method of controlling a program voltage, in which an Increment Step Pulse Program (ISPP) voltage provided for program and verification can be controlled according to a cell characteristic.

In general, a flash memory device performs a program operation, an erase operation and a read operation. The program operation of the flash memory device is executed on a page basis. In this operation, memory cells are programmed by applying a word line bias voltage to word lines to which the memory cells of a selected page are connected.

The ISPP programming method programs a selected page several times while gradually increasing a word line bias voltage on a step-voltage basis.

In the ISPP method, in order to program memory cells corresponding to one page, programming is performed by applying a first voltage Vp1 to a word line at a first time T1. For program verification, a verify voltage Vf1 is then applied to the word line at a second time T2. Thereafter, at a third time T3, a second voltage Vp2 is applied to the word line in order to perform the programming. The verify voltage Vf1 is then applied at the second time T2 for program verification. As described above, the bias voltages Vp applied to the word line on a program-step basis are sequentially applied at a predetermined amount.

If the programming is performed by applying voltage to the word line using the ISPP method, a wide distribution of cell voltages results due to the same bias step. Accordingly, it is difficult to apply the ISPP method to MLCs requiring a narrow cell voltage distribution.

SUMMARY OF THE INVENTION

Accordingly, the present invention addresses the above problems, and discloses a flash memory device and a method of controlling a program voltage. The flash memory device can control voltages provided in the ISPP method so that programming time can be reduced and narrow cell voltage distribution can be achieved.

In one aspect, the present invention provides a NAND flash memory device including a memory cell array, a page buffer unit, a X decoder and a Y decoder, an IO controller and a voltage providing unit. The memory cell array includes memory cells connected to bit lines and word lines. The page buffer unit includes cell program test circuits disposed corresponding to the bit lines and configured to program data into a selected memory cell or read data from the memory cell. A cell program test circuit identifies whether a corresponding selected memory cell has been programmed. The X decoder and the Y decoder select a word line of the memory cell array according to an input address. The IO controller is configured to control data input to and output from the page buffer unit through the Y decoder. The IO controller also includes a program confirm decision circuit for outputting a cell program confirmation signal when a cell has been programmed. The voltage providing unit changes a step of a program voltage according to the cell program confirmation signal and provides the program voltage.

In another aspect, the present invention provides a method of controlling a program voltage of a flash memory device. The method includes performing a data program by applying a program voltage to a cell using an ISPP method having a voltage step of a first value, and determining whether a cell is programmed. In the event that one or more cells are identified as programmed, a data program is performed by applying a program voltage to a cell using an ISPP having a voltage step of a second value.

In still another aspect, the present invention provides a method of controlling a program voltage of a flash memory device. The method includes performing a data program by applying a program voltage to a cell using an ISPP method having a voltage step of a first value, and determining whether a cell is programmed. In the event that one or more cells are identified as programmed, a data program is performed by applying a program voltage to a cell using an ISPP having a voltage step of a second value and then performing a double verification.

BRIEF DESCRIPTION OF THE DRAWINGS

FIG. 2A is a waveform illustrating an ISPP control method according to a first embodiment of the present invention;

FIGS. 3B and 3C are views illustrating the program voltage distributions of a cell employing the ISPP method and the double verification method according to an embodiment of the present invention.

DETAILED DESCRIPTION OF EMBODIMENTS

Specific embodiments will be described with reference to the accompanying drawings.

Figure 1A:
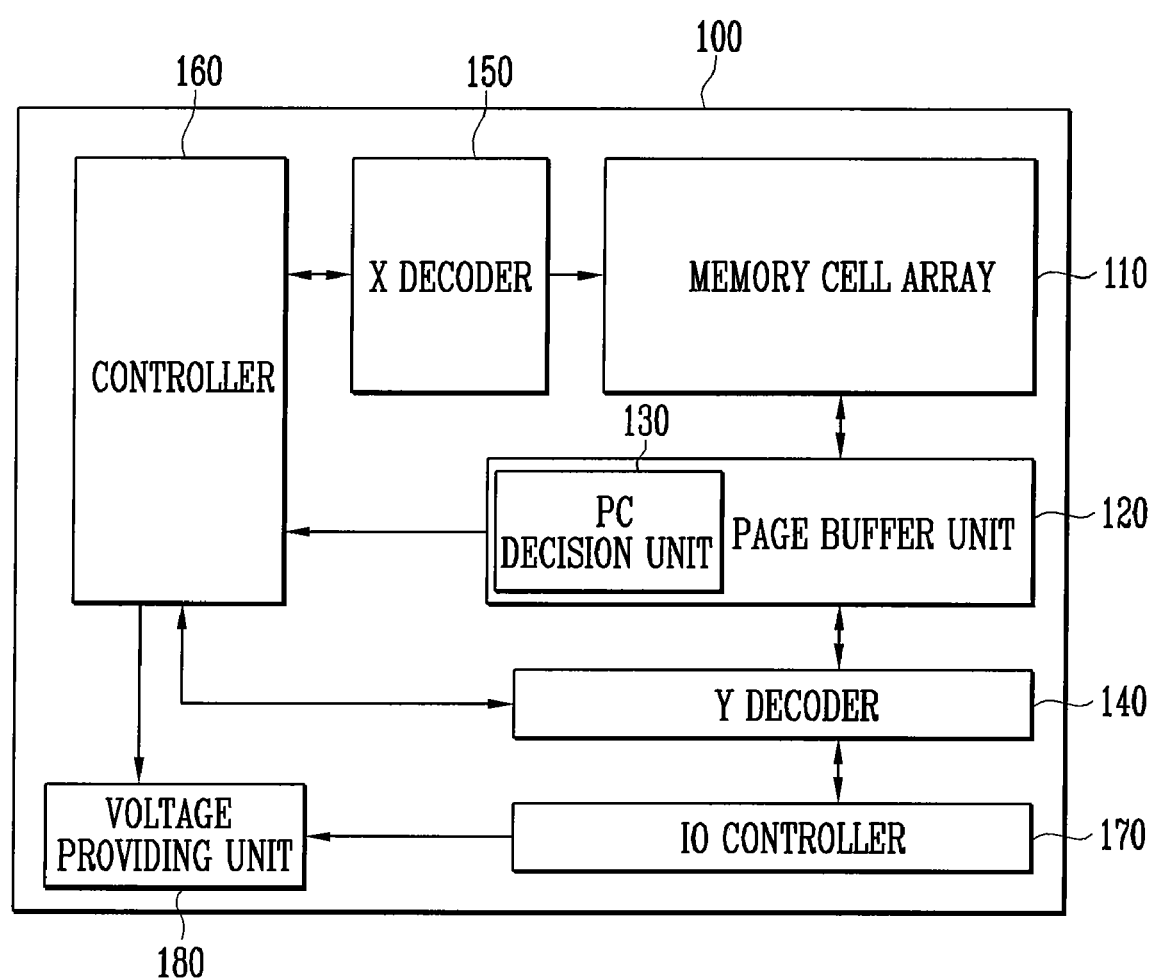
FIG. 1A is a block diagram of a flash memory device according to an embodiment of the present invention.

FIG. 1A is a block diagram of a flash memory device according to an embodiment of the present invention.

Referring to FIG. 1A, a flash memory device 100 according to an embodiment of the present invention includes a memory cell array 110, a page buffer unit 120, a X decoder 150, a Y decoder 140, a PC decision unit 130, a controller 160, an IO controller 170, and a voltage providing unit 180. The memory cell array 110 has a plurality of memory cells for data programming. The page buffer unit 120 includes a plurality of page buffer circuits for data programming or reading a selected memory cell of the memory cell array 110. The X decoder 150 and the Y decoder 140 select memory cells of the memory cell array 110 according to an input address. The PC decision unit 130 is connected to a sensing node of the page buffer unit 120 and is configured to output a cell program confirmation signal when a cell is programmed. The controller 160 controls a program voltage according to the cell program confirmation signal output from the PC decision unit 130. The IO controller 170 controls data I/O through the Y decoder 140. The voltage providing unit 180 provides the program voltage under control of the controller 160. The flash memory device 100 can provide the program voltage in the ISPP method at the time of programming.

As shown in FIG. 1A, the PC decision unit 130 is included in the page buffer unit 120. However, the PC decision unit 130 is connected to each page buffer circuit. Thus, in an alternative embodiment, each page buffer circuit may correspond to a separate PC decision unit.

Figure 1B:
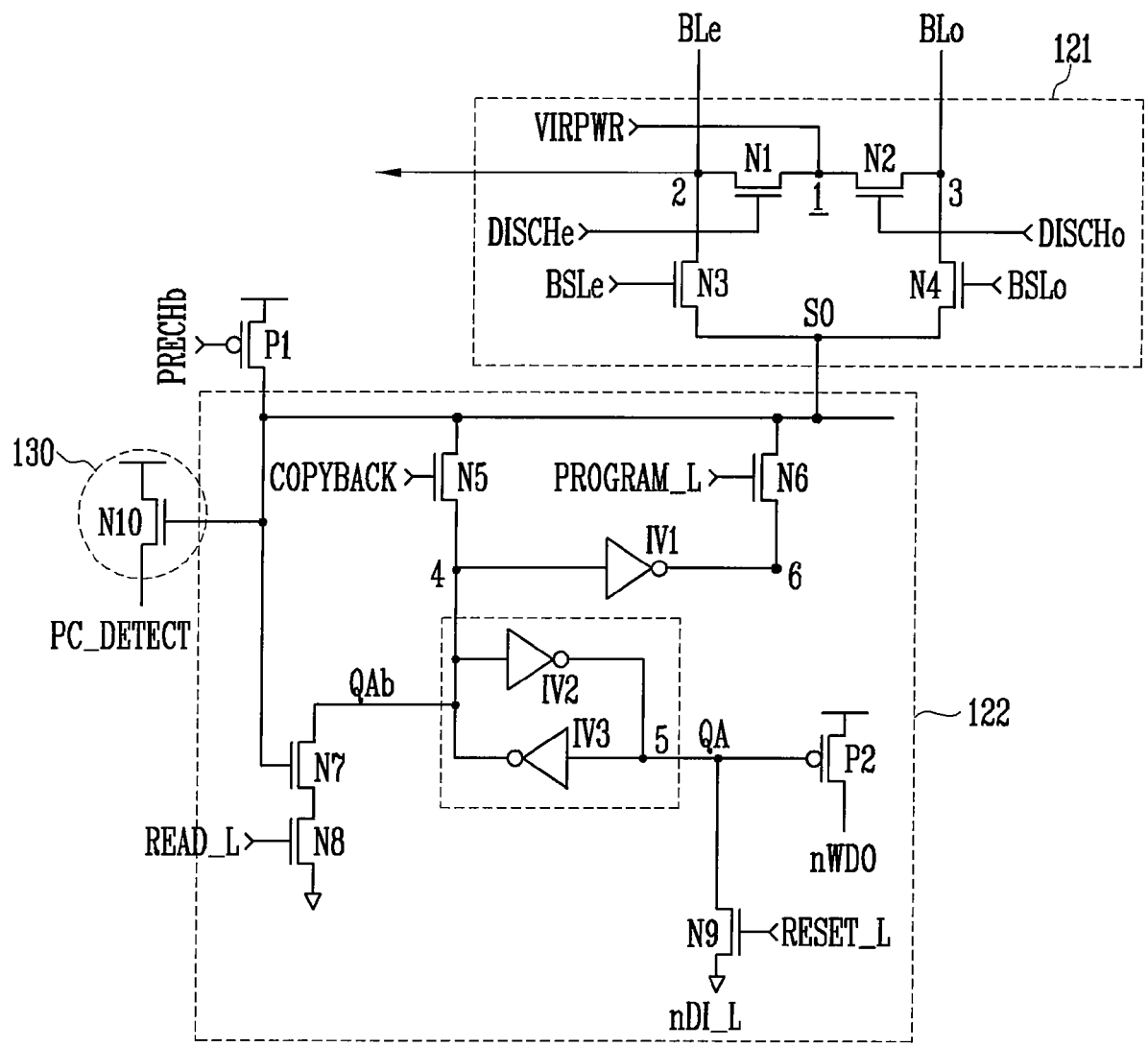
FIG. 1B is a partial circuit diagram of a page buffer unit and a Program Cell (PC) decision unit shown in FIG. 1A.

FIG. 1B is a partial circuit diagram of the page buffer unit and the PC decision unit shown in FIG. 1A.

Referring to FIG. 1B, the page buffer 120 for programming or reading a memory cell (not illustrated) of the memory cell array 110 includes a bit line select unit 121 and a buffer unit 122. The bit line select unit 121 selects one pair of bit lines according to an input address. The buffer unit 122 is connected to the bit line select unit 121 through a sensing node SO. The buffer unit 122 is configured to latch data to be programmed or latch the data of a memory cell, and input or output the latched data. The PC decision unit 130 is connected to the sensing line SO and outputs a program confirmation signal PC_DETECT of a memory cell.

The bit line select unit 121 includes first to fourth NMOS transistors N1 to N4. The buffer unit 122 includes fifth to ninth NMOS transistors N5 to N9. The PC decision unit 130 includes a tenth NMOS transistor N10. The buffer unit 122 is partially illustrated in FIG. 1B to illustrate the connection relationship with the PC decision unit 130.

The gate of the tenth NMOS transistor N10 is connected to the sensing node SO through which the buffer unit 122 and the bit line select unit 121 are connected. The tenth NMOS transistor N10 receives a power supply voltage and outputs the cell program confirmation signal PC_DETECT according to the voltage level of the sensing node SO.

The cell program confirmation signal PC_DETECT output from each of the plurality of page buffer circuits is output as a detection signal (detect) through IO controller 170. In order to output the program confirmation signal detect, the IO controller 170 includes the following circuit.

Figure 1C:
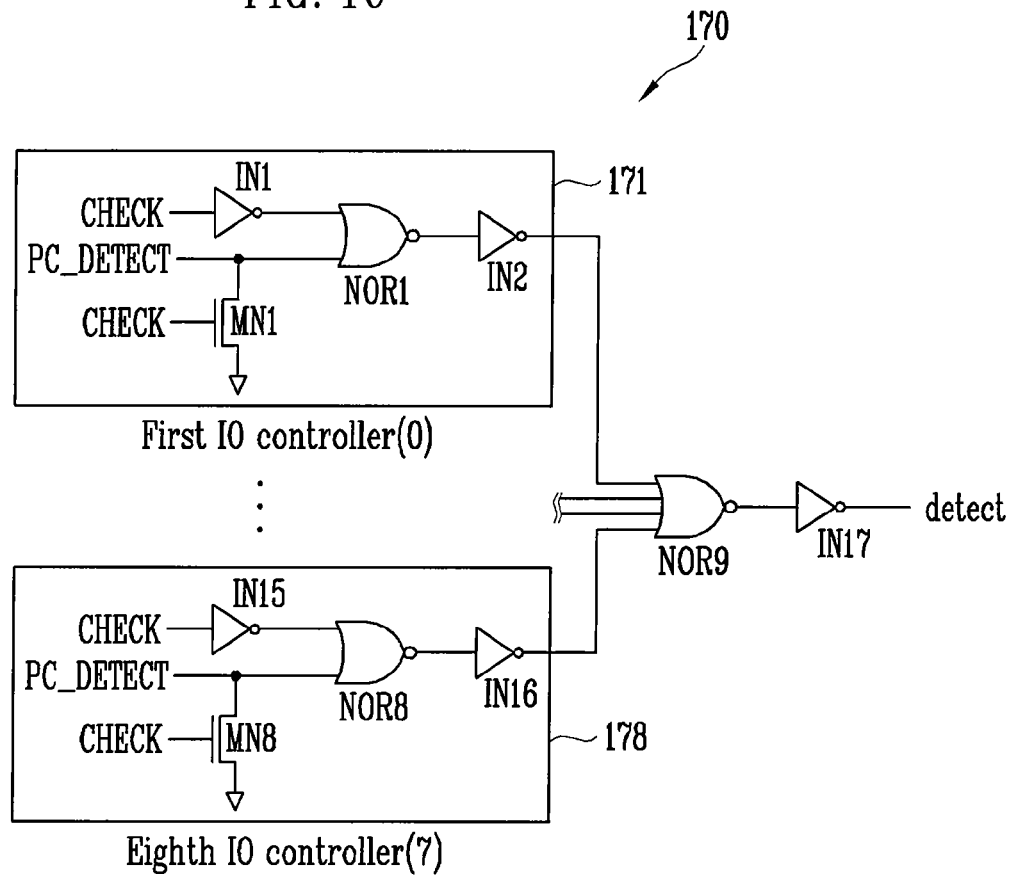
FIG. 1C is a circuit diagram of a detecting circuit of an IO controller shown in FIG. 1A.

FIG. 1C is a circuit diagram of the detecting circuit of the IO controller shown in FIG. 1A.

Referring to FIG. 1C, the IO controller 170 includes first to eighth IO controllers 171 to 178, which correspond to the plurality of page buffer circuits.

The first to eighth IO controllers 171 to 178 receive the cell program confirmation signals PC_DETECT output from the page buffer circuits, and then output the control signals. The control signals are logically combined. The program confirmation signal detect is then output to the voltage providing unit 180 to change an ISPP program step.

The first to eighth IO controllers 171 to 178 can include a circuit for outputting the cell program confirmation signal PC_DETECT as a control signal. The first IO controller 171 will be representatively described below.

The first IO controller 171 includes first and second inverters IN1, IN2, a first NOR gate NOR1, and a NMOS transistor MN1.

The first inverter IN1 inverts a control signal CHECK received from the controller 160, and outputs an inverted signal. The output of the first inverter IN1 is input to one terminal of the first NOR gate NOR1. The cell program confirmation signal PC_DETECT of the PC decision unit 130 is provided to the other input terminal of the first NOR gate NOR1.

The NMOS transistor MN1 is connected between the input terminal of the cell program confirmation signal PC_DETECT and a ground line. The NMOS transistor MN1 controls the input of the cell program confirmation signal PC_DETECT according to a check signal.

The first NOR gate NOR1 outputs a High level signal when both input signals are at a Low level. The first IO controller 171 controls the second inverter IN2 to output the control signal at a Low level. The PC decision unit 130 outputs the cell program confirmation signal PC_DETECT when any memory cell is programmed.

Verification is performed after data is programmed through the page buffer unit 120. If a memory cell is programmed, the sensing node SO maintains the voltage of a precharged High level so that the tenth NMOS transistor N10 is activated. Thus, a programmed cell is detected because a High level cell program confirmation signal PC_DETECT is output.

If any of the plurality of page buffer units 120 is programmed, the cell program confirmation signal PC_DETECT is output, and the first IO controller 171 outputs a Low level signal. As described above, the control signals output from the first to eighth IO controllers 171 to 178 are input to the ninth NOR gate NOR9. The output of the ninth NOR gate NOR9 is inverted by a seventeenth inverter IN17 and is then output as the program confirmation signal detect.

The High level signal is output from the ninth NOR gate NOR9 when all inputs are at a Low level. The program confirmation signal detect is output at a High level when any cell has been programmed. Thus, the ISPP step may be finely controlled.

When none of the cells are programmed, the flash memory device operates in a rough ISPP mode in which the step amount of an ISPP voltage is large. When any cell is identified as programmed, the flash memory device operates in a detailed ISPP mode in which the step amount of an ISPP voltage is small.

The voltage providing unit 180 for controlling the ISPP step according to the detection signal (detect) is constructed as follows.

Figure 1D:
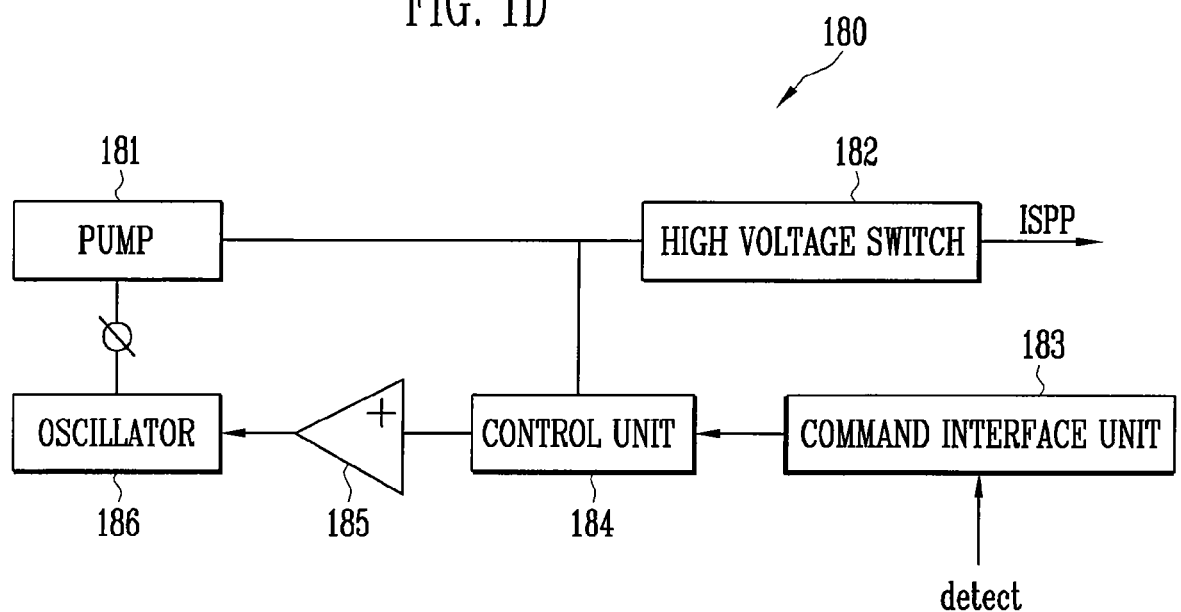
FIG. 1D is a circuit diagram of a voltage providing unit shown in FIG. 1A.

FIG. 1D is a circuit diagram of the voltage providing unit shown in FIG. 1A.

Referring to FIG. 1D, the voltage providing unit 180 includes a pump 181, a high voltage switch 182, a command interface unit 183, a control unit 184, an increment and decrement unit 185, and an oscillator 186. The pump 181 generates voltage. The high voltage switch 182 transfers an ISPP voltage of the high voltage generated by the pump 181 to a memory cell. The command interface unit 183 performs an ISPP step control based on the control signal from the controller 160 and the program confirmation signal detect from the IO controller 170. The control unit 184 controls the command interface unit 183 to the ISPP step. The increment and decrement unit 185 increases or decreases the amount of the ISPP step under control of the control unit 184. The oscillator 186 outputs a clock signal by changing a clock according to an increment and decrement control signal received from the increment and decrement unit 185.

The output voltage of the pump 181 is controlled according to a clock cycle of the oscillator 186. Therefore, if the program confirmation signal detect output from the IO controller 170 is input to the command interface unit 183, the command interface unit 183 transfers a command in which the ISPP step is finely controlled in the detailed mode to the control unit 184.

The control unit 184 controls the increment and decrement unit 185 so that the oscillator 186 finely controls the ISPP step in the detailed mode. The pump 181 generates an ISPP voltage that is finely controlled according to the cycle of the clock signal output from the oscillator 186.

When none of the cells are programmed, the flash memory device operates in a rough ISPP mode in which the step amount of the ISPP voltage is large. When a cell is identified as being programmed, the flash memory device operates in the detailed ISPP mode in which the step amount of the ISPP voltage is small.

A waveform illustrating a variation in the ISPP step, which is changed according to the rough ISPP mode and the detailed ISPP mode, is described with reference to FIGS. 2A-2C.

Figure 2B:
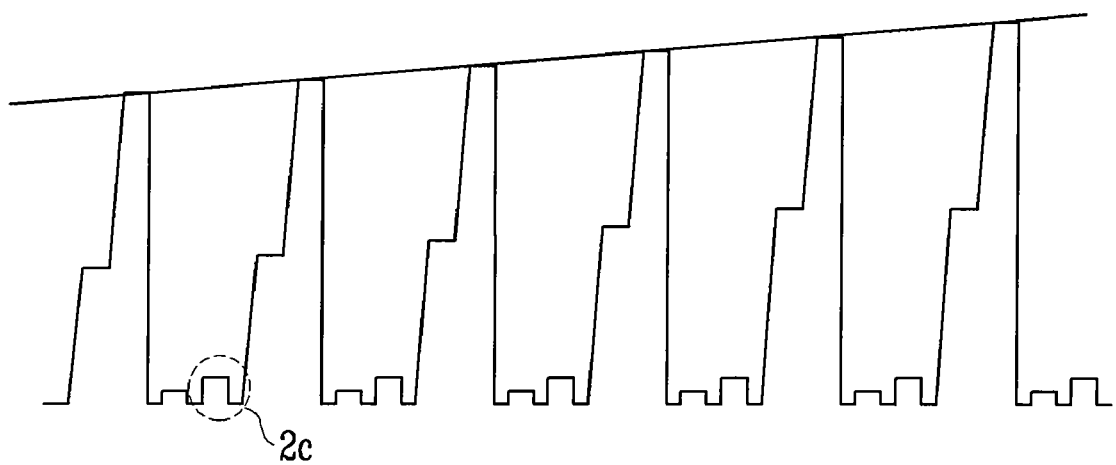
FIGS. 2B and 2C are waveforms illustrating an ISPP control method according to a second embodiment of the present invention.

FIG. 2A is a waveform illustrating an ISPP control method according to a first embodiment of the present invention. FIGS. 2B and 2C are waveforms illustrating an ISPP control method according to a second embodiment of the present invention.

In FIG. 2A, a waveform indicated by dotted lines 210, 211 illustrates a voltage step according to a general ISPP method in which a voltage is provided and verification is performed. A waveform indicated by solid lines 220, 221 illustrates the ISPP providing method in which, if a cell is programmed, a step distance is reduced so that the device operates in the detailed ISPP mode.

In FIG. 2A, a section 2a indicates where the ISPP voltage is provided in the rough ISPP mode where no cells are programmed. A section 2b indicates where one or more cells are programmed such that the program confirmation signal PC_DETECT is generated and the device operates in the detailed ISPP mode.

As illustrated in FIG. 2A, the step of the ISPP voltage in the section 2b becomes smaller than the voltage in the section 2a.

Thus, since the program voltage can be finely controlled, cell voltage distributions become narrower.

FIG. 2B is a graph illustrating voltages according to a general ISPP operation method. After a program voltage is supplied in a double verification method while supplying the program voltage in the ISPP method, double verifications 2c are performed with different verify voltages, resulting in narrow cell voltage distributions.

After the program voltage is supplied, the double verification 2c is performed based on a read voltage. The verification is then performed again based on a verify voltage. Thus, the cell voltages have a narrow distribution.

Figure 2C:
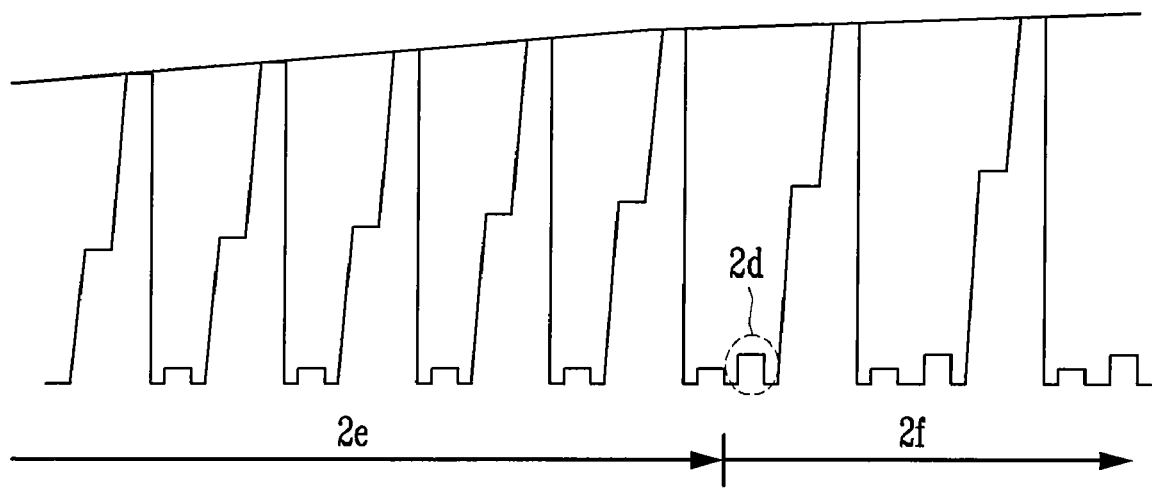

If the ISPP control method according to an embodiment of the present invention is applied to the general double verification ISPP method of FIG. 2B, a voltage graph as illustrated in FIG. 2C is obtained.

Double verification is not performed on a section 2e, and the ISPP voltage is provided in a general rough step so that the device operates in the rough ISPP mode. After a programmed cell is identified, double verification 2d begins in a section 2f. The ISPP voltage step is finely controlled in the detailed ISPP mode, resulting in a narrower cell voltage distribution.

Figure 3A:
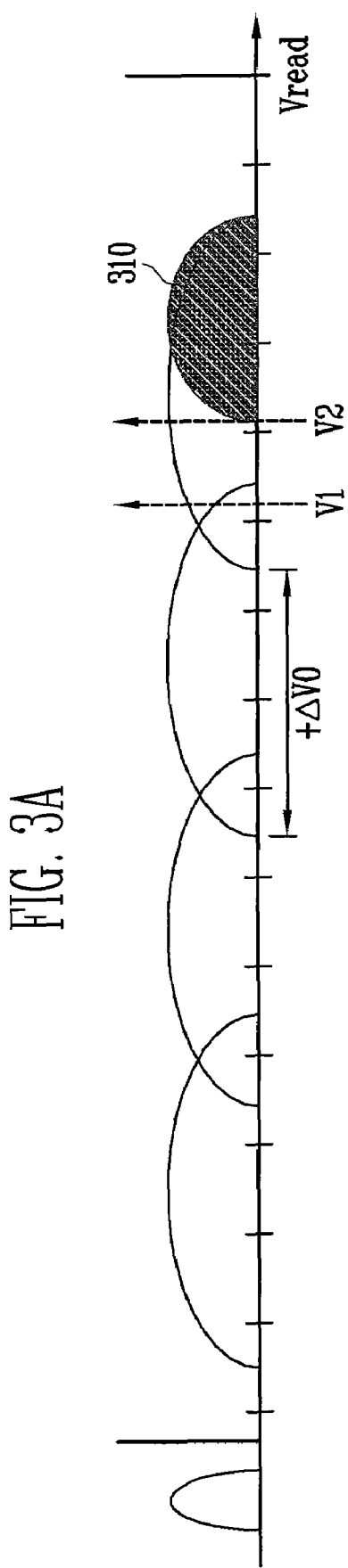
FIG. 3A is a view illustrating the distribution of program cell voltages using a general ISPP method.
Figure 3B:
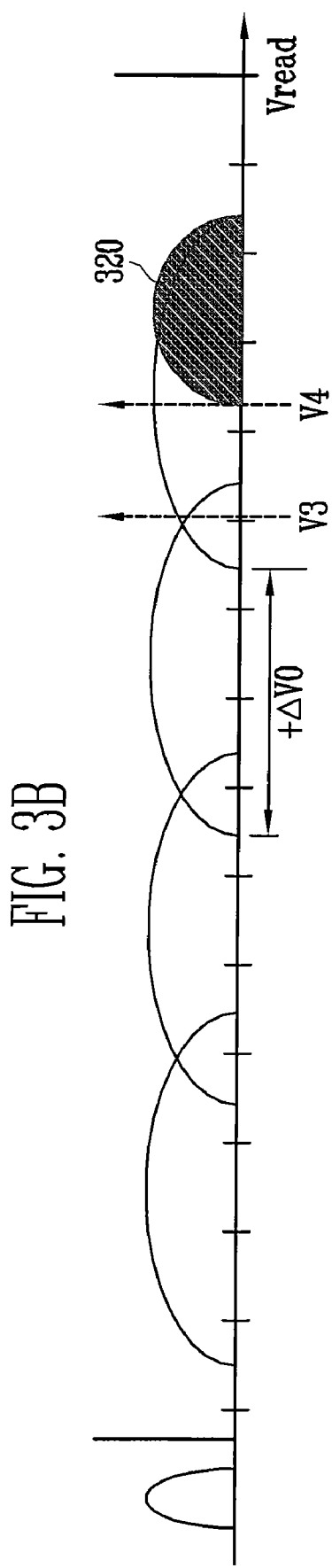

FIG. 3A is a view illustrating the voltage distribution when programming cells using a general ISPP method. FIGS. 3B and 3C are views illustrating the voltage distribution when programming cells using the ISPP method and the double verification method according to an embodiment of the present invention.

FIGS. 3A to 3C illustrate cell voltage distributions when ISPP control is performed according to an embodiment of the present invention. FIG. 3A illustrates cell voltage distributions 310 using the ISPP providing method employing a general double verification method. FIG. 3B illustrates cell voltage distributions 320 when the device operates in the detailed ISPP mode after a cell is programmed using the ISPP control method while performing double verification. FIG. 3C illustrates cell voltage distributions 330 when the double verification method and the ISPP control method according to an embodiment of the present invention are used at the same time.

When comparing the cell voltage distributions 310, 320 and 330 of FIGS. 3A to 3C, cell voltage distributions are narrowed by the ISPP control method according to an embodiment of the present invention, so that a cell characteristic is improved.

Furthermore, as described above, the ISPP step does not initially operate in the detailed mode. The detailed ISPP mode begins after one programmed cell is identified. Thus, an actual program time is not significantly influenced, and finely distributed cell voltages can be obtained.

In order to control the ISPP step, the voltage providing unit provides a general ISPP method. This can be implemented in various ways, such as by providing a fine resistance value of the ISPP circuit.

As described above, according to the present invention, voltage provided to program data into a memory cell is controlled, and a check circuit determines whether a cell has been programmed. If it is determined that a cell has been programmed, a subsequent ISPP voltage step can be finely controlled so that narrow cell voltage distributions result.

Although the foregoing description has been made with reference to specific embodiments, it is to be understood that changes and modifications of the present patent may be made by one having ordinary skill in the art without departing from the spirit and scope of the present patent and appended claims.

What is claimed is:

1. A NAND flash memory device comprising:
a memory cell array including memory cells, wherein each memory cell is connected to bit lines and word lines;
a page buffer unit including page buffer circuits disposed corresponding to the bit lines and configured to program data into selected memory cells or read data from the memory cells;
a plurality of program cell decision units respectively connected to the page buffer circuits and configured to output cell program confirmation signals corresponding to program states of the memory cells;
a X decoder and a Y decoder for selecting a word line of the memory cell array according to an input address;
an IO controller configured to control data input to and output from the page buffer unit through the Y decoder, and including a detecting circuit configured to output a detection signal in the event that one or more of the memory cells are identified as programmed based on the cell program confirmation signals; and
a voltage providing unit for changing a step of a program voltage according to the detection signal, wherein the voltage providing unit provides a program voltage.

2. The NAND flash memory device of claim 1, wherein:
in the event that the detection signal is disabled, the voltage providing unit operates in a first voltage control mode where a voltage step is increased by a first value,
in the event that the detection signal is disabled, the voltage providing unit operates in a second voltage control mode where a voltage step is increased by a second value, and the first value is greater than the second value.

3. The NAND flash memory device of claim 2, wherein the first and second voltage control modes include an Increment Step Pulse Program (ISPP) control mode.

4. The NAND flash memory device of claim 2, wherein when the voltage providing unit operates in the second voltage control mode, a double program verification is performed.

5. The NAND flash memory device of claim 1, wherein each program cell decision unit includes an NMOS transistor having a drain connected to a power supply voltage, a gate connected to a sensing node of the page buffer circuit, and a source from which a signal is output.

6. The NAND flash memory device of claim 1, wherein the program cell decision unit is connected to a sensing node of the page buffer circuit.

7. A method of controlling a program voltage of a flash memory device, the method comprising:
   performing a first data program by applying a first program voltage to a word line to which a plurality of memory cells are connected using a first ISPP method that increases the first program voltage by a first increased value when the first data program is performed;
   determining whether the memory cells are programmed; and
   in the event that one or more cells are identified as programmed, performing a second data program by applying a second program voltage to the word line using a second ISPP method that increases the second program voltage by a second increased value when the second data program is performed,
   wherein the first increased value of the first program voltage is different from the second increased value of the second program voltage.

8. The method of claim 7, wherein the increased value of the first program voltage is greater than the increased value of the second program voltage.

9. A method of controlling a program voltage of a flash memory device, the method comprising:
   performing a data program by applying a program voltage to a word line to which a plurality of memory cells are connected using an ISPP method having a voltage step of a first value;
   determining whether is the memory cells are programmed; and
   in the event that one or more cells are identified as programmed, performing a data program by applying a program voltage to the word line using an ISPP method having a voltage step of a second value and performing a double verification.

10. The method of claim 9, wherein the voltage step of the first value is greater than the voltage step of the second value.

* * * * *